United States Patent
Chen et al.

(10) Patent No.: US 10,939,581 B1
(45) Date of Patent: Mar. 2, 2021

(54) IMMERSION LIQUID COOLING RACK

(71) Applicant: Quanta Computer Inc., Taoyuan (TW)

(72) Inventors: Chao-Jung Chen, Taoyuan (TW);
Yu-Nien Huang, Taoyuan (TW);
Yung-Hsiang Lu, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 16/858,113

(22) Filed: Apr. 24, 2020

Related U.S. Application Data

(60) Provisional application No. 62/961,574, filed on Jan. 15, 2020.

(51) Int. Cl.
*H05K 7/20* (2006.01)

(52) U.S. Cl.
CPC ..... *H05K 7/20236* (2013.01); *H05K 7/20781* (2013.01)

(58) Field of Classification Search
CPC ....... A47B 67/04; A47B 88/04; A47B 88/919; H05K 7/20236; H05K 7/20781; H05K 7/20272; H05K 7/203; H05K 7/20818; H05K 7/20772; H05K 7/1489; H05K 7/20; H05K 7/20281; H05K 7/20763; H05K 7/20836; H05K 7/1487; H05K 7/20327; H05K 7/20809; G06F 1/20; G06F 2200/201; G06F 1/206

See application file for complete search history.

(56) References Cited

U.S. PATENT DOCUMENTS

| | | | | |
|---|---|---|---|---|
| 3,586,410 A * | 6/1971 | Barrow | ................. | A47B 63/00 312/323 |
| 3,857,623 A * | 12/1974 | Schneller | ............. | A47B 46/005 312/266 |
| 4,372,632 A * | 2/1983 | Villa | .................... | E05B 65/463 312/311 |
| 8,424,983 B1 * | 4/2013 | Strauss | ................. | A47B 51/00 312/247 |
| 9,265,173 B1 * | 2/2016 | Jhang | ..................... | G06F 1/187 |
| 9,801,465 B1 * | 10/2017 | Finch, Jr. | ............... | B66F 13/00 |
| 9,861,194 B1 * | 1/2018 | Park | ....................... | A47B 97/00 |
| 10,653,036 B1 * | 5/2020 | Gao | ................... | H05K 7/20236 |
| 10,750,637 B1 * | 8/2020 | Alissa | ............... | H05K 7/20818 |

(Continued)

*Primary Examiner* — Binh B Tran
*Assistant Examiner* — Michael A Matey
(74) *Attorney, Agent, or Firm* — Nixon Peabody LLP

(57) ABSTRACT

An immersion liquid cooling tank rack for heat-generating components includes immersion liquid cooling tanks for containing a coolant liquid. Horizontal extendable slide rails are mounted on opposing side faces of each tank and on opposing side walls of the rack. The horizontal extendable slide rails are movable between a closed position and an extended open position to allow the tanks to slide horizontally in and out of the rack. Support structures are mounted to the base of each of the immersion liquid cooling tanks. Each support structure includes a wheel assembly disposed at the base of the support structure. The support structures extend from the base of the tank to a floor surface supporting the rack. The horizontal extendable slide rails and the support structures substantially support an operational immersion liquid cooling tank during a horizontal translation of the tank between the closed position and the extended open position.

20 Claims, 3 Drawing Sheets

(56) References Cited

U.S. PATENT DOCUMENTS

| | | | | |
|---|---|---|---|---|
| 2010/0033070 A1* | 2/2010 | Cheng | ............... | H05K 7/1421 |
| | | | | 312/334.7 |
| 2010/0101759 A1* | 4/2010 | Campbell | ......... | H05K 7/20772 |
| | | | | 165/80.4 |
| 2011/0183051 A1* | 7/2011 | Skender | ................... | A23L 5/10 |
| | | | | 426/240 |
| 2014/0055959 A1* | 2/2014 | Manda | ............... | G11B 33/128 |
| | | | | 361/728 |
| 2015/0035423 A1* | 2/2015 | Raunikar | .............. | A47B 88/40 |
| | | | | 312/323 |
| 2017/0303440 A1* | 10/2017 | Shimasaki | ........ | H05K 7/20509 |
| 2017/0325358 A1* | 11/2017 | Franz | ............... | H05K 7/20236 |
| 2018/0027695 A1* | 1/2018 | Wakino | ............. | H05K 7/20772 |
| | | | | 361/699 |
| 2018/0343770 A1* | 11/2018 | Brink | ............... | H05K 7/20245 |
| 2019/0329973 A1* | 10/2019 | Chabot | ................. | B65D 90/14 |
| 2020/0150731 A1* | 5/2020 | Wang | ...................... | H05K 7/20 |
| 2020/0196489 A1* | 6/2020 | Chang | ............... | H05K 7/20772 |

* cited by examiner

IMMERSION LIQUID COOLING RACK

PRIORITY CLAIM

The present disclosure claims priority to U.S. Provisional Application Ser. No. 62/961,574, entitled "IMMERSION LIQUID COOLING RACK", filed Jan. 15, 2020. The contents of that application is hereby incorporated by reference in its entirety.

TECHNICAL FIELD

The present disclosure relates generally to immersion liquid cooling systems. More specifically, aspects of this disclosure relate to an immersion liquid cooling rack for computer equipment.

BACKGROUND

Computer components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In an immersion liquid cooling system, computing components, such as servers, switches, and storage devices, will be immersed in a tank holding coolant. The chassis of such a system is not sealed, and the coolant liquid can circulate between and through the components to carry away generated heat. For servicing, the computing components are pulled out from the top of the tank. The computing components are typically placed side-by-side where the tank foot print limits the quantity of devices in a tank.

Thus, there is a need for system that can increase the quantity of computing components that can be stored in an immersion liquid cooling system.

SUMMARY

According to one embodiment, an immersion liquid cooling rack for heat-generating components includes a plurality of immersion liquid cooling tanks each having a base and side faces for containing a coolant liquid. Horizontal extendable slide rails are mounted on opposing side faces of each immersion liquid cooling tank and on opposing side walls of the rack. The horizontal extendable slide rails are movable between a closed position and an extended open position to allow the immersion liquid cooling tanks to slide horizontally in and out of the rack. A plurality of support structures are mounted to the base of each of the plurality of immersion liquid cooling tanks. Each support structure includes a wheel assembly disposed at the base of the support structure. The support structures extend from the base of the immersion liquid cooling tank to a floor surface supporting the rack, such that the horizontal extendable slide rails and the support structures with wheel assemblies substantially support an operational immersion liquid cooling tank during a horizontal translation of the tank between the closed position and the extended open position.

A further aspect of the embodiment includes the immersion liquid cooling tanks being vertically aligned in a column such that one tank is disposed on top of another tank. In another aspect of the embodiment, the plurality of immersion liquid cooling tanks includes three or more immersion liquid cooling tanks. In a further aspect of the embodiment, the operational liquid cooling tank includes coolant liquid and a plurality of heat generating components disposed in the tank. In yet a further aspect of the embodiment, the plurality of immersion liquid cooling tanks each have an open top that is inaccessible when the tank is in the closed position, and accessible when the tank is the extended open position. In another aspect of the embodiment, heat-generating components are installed and removed from the open top when the immersion liquid cooling tanks are in the extended open position. In yet another aspect of the embodiment, the plurality of support structures includes two elongated struts extending downwardly from the base near the front side wall corners of each immersion liquid cooling tank. In a further aspect of the embodiment, a front facing surface of the support structures is substantially flush with the front walls of the plurality of immersion liquid cooling tanks when all the immersion liquid cooling tanks are in the closed position. In another aspect of the embodiment, the support structures for the immersion liquid cooling tanks counter eccentric loads on the immersion liquid cooling tank rack when one or more of the immersion liquid cooling tanks are in the extended open position. In yet a further aspect of the embodiment, the wheel assembly includes caster wheels or a roller. In another aspect of the embodiment, each side face of the plurality of immersion liquid cooling tanks has at least two horizontal extendable slide rails. In yet another aspect of the embodiment, the heat-generating components include one or more of a storage server, application server, or switch device.

According to another embodiment, a method for making an immersion liquid cooling tank rack for storing heat-generating components includes providing a plurality of immersion liquid cooling tanks. Each tank defines an interior containment space for holding coolant liquid and heat-generating components. Extendable slide rails are installed on opposing side faces of each immersion liquid cooling tank and on opposing side walls of the rack. The extendable slide rails are movable between a closed position and an extended open position to allow the immersion liquid cooling tanks to slide in and out of the rack. A plurality of support structures are mounted to the base of each of the plurality of immersion liquid cooling tanks. Each support structure includes a wheel assembly disposed at the base of the support structure. The support structures extend from the base of the immersion liquid cooling tank to a floor surface supporting the rack. The horizontal extendable slide rails, and the support structures with wheel assemblies, substantially support an operational immersion liquid cooling tank during a horizontal translation of the tank between the closed position and the extended open position.

A further aspect of the embodiment includes vertically aligning the immersion liquid cooling tanks in a column such that one tank is disposed on top of another tank. In another aspect of the embodiment, the plurality of immersion liquid cooling tanks includes three or more immersion liquid cooling tanks. In yet another aspect of the embodiment, the plurality of immersion liquid cooling tanks each have an open top that is inaccessible when the tank is in the closed position and accessible when the tank is the extended open position. In a further aspect of the embodiment, heat-generating components are installed and removed from the open top when the immersion liquid cooling tanks are in the extended open position. In another aspect of the embodiment, a front facing surface of the support structures is substantially flush with the front walls of the plurality of immersion liquid cooling tanks when all the immersion liquid cooling tanks are in the closed position. In yet a further aspect of the embodiment, the support structures for the immersion liquid cooling tanks counter eccentric loads on the immersion liquid cooling tank rack when one or more of the immersion liquid cooling tanks are in the extended open position. In another aspect of the embodiment, each side face of the plurality of immersion liquid cooling tanks has at least two horizontal slide rails.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
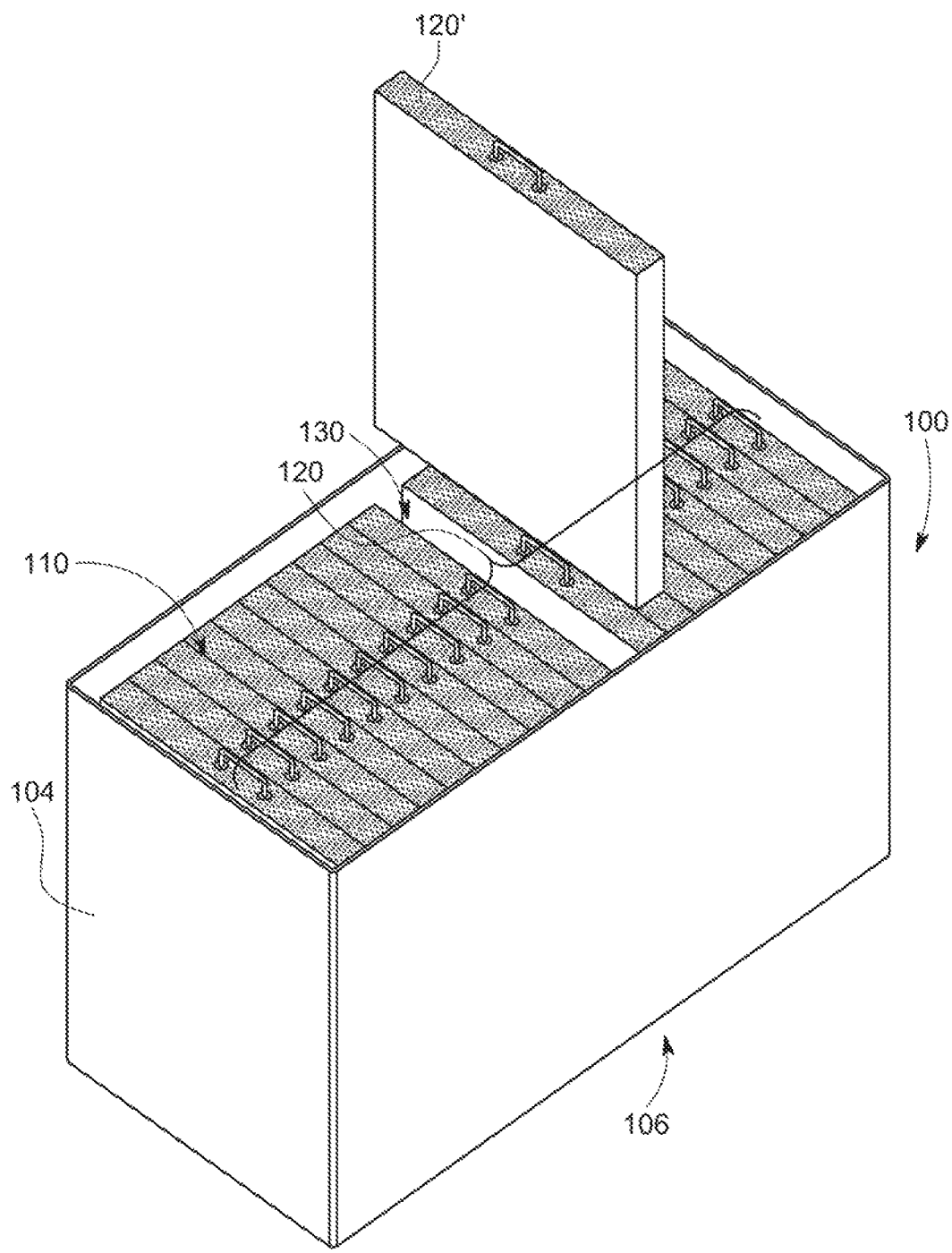
FIG. 1 is a perspective view of an immersion liquid cooling tank, according to some implementations of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present technology relates to an immersion liquid cooling rack that includes multiple immersion liquid cooling tanks disposed on rails mounted to side walls or otherwise supported by the rack. The tanks are vertically aligned one on top of another. Each immersion liquid cooling tank can slide along the rails from a closed position where the open top of the tank is inaccessible to an open position that exposes an open top of the tank. In the open position, heat-generating components can be installed and removed from the respective tank that is in an open position. The immersion liquid cooling tanks include a tank support at the front facing side where the tanks slide out from rack. The support(s) extend to the floor surface to support the rack and can include supporting wheels to roll, along with the tank, from the closed to the open position and readily allow the tank to slide out of the rack.

Supports for the tank extending to the floor surface are desirable for an immersion liquid cooling tank rack to counter and minimize eccentric loads on the rack when the immersion liquid cooling tanks are in the open position. Immersion liquid cooling tanks are extremely heavy due to the liquid coolant in the tank that acts as the heat-sink for the heat-generating components disposed in the tank, along with the weight of the heat-generating components themselves. The weight of an immersion liquid cooling tank filled with liquid coolant, along with installed heat-generating components, can be on the order of at least hundreds of pounds or more.

FIG. 1 is a perspective view of an immersion liquid cooling tank 100, according to some implementations of the present disclosure. The immersion liquid cooling tank 100 includes an open top 110 and a series of heat-generating components 120, such as storage servers, application servers, switches, or other electronic devices. The heat-generating components 120 are immersed in a liquid coolant in a containment space 130 defined by side walls 104 and a base 106 of the cooling tank 100. The heat-generating components 120 can be serviced by pulling heat-generating components, such as heat-generating component 120', out of the cooling tank 100 and replacing the component as needed. The present technology contemplates an immersion liquid cooling tank, such as cooling tank 100, being disposed in a rack system as described in more detail in FIGS. 2 and 3.

Figure 2:
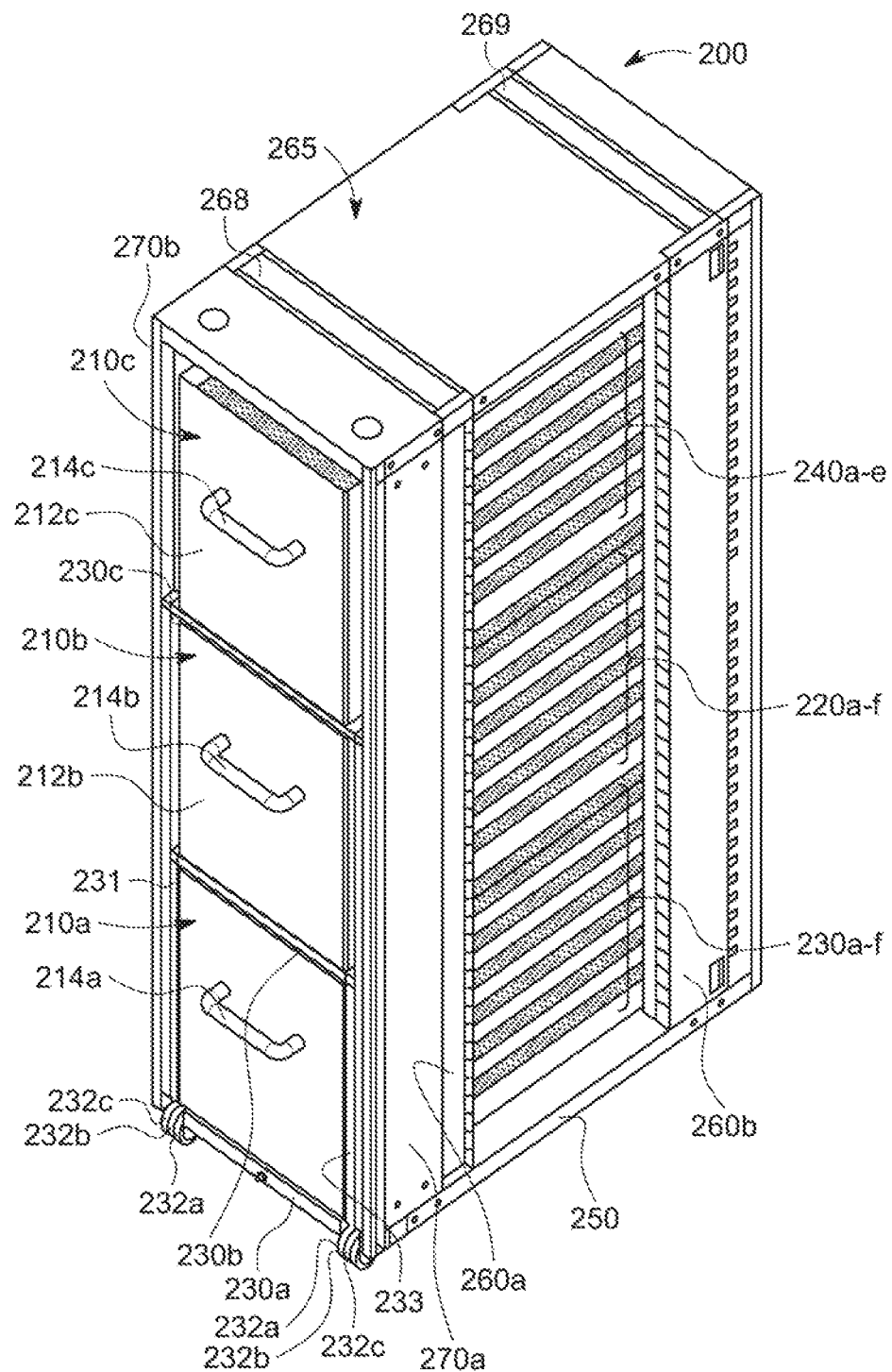
FIG. 2 is a perspective view of an immersion liquid cooling rack including a plurality of stacked immersion liquid cooling tanks, according to some implementations of the present disclosure.
Figure 3:
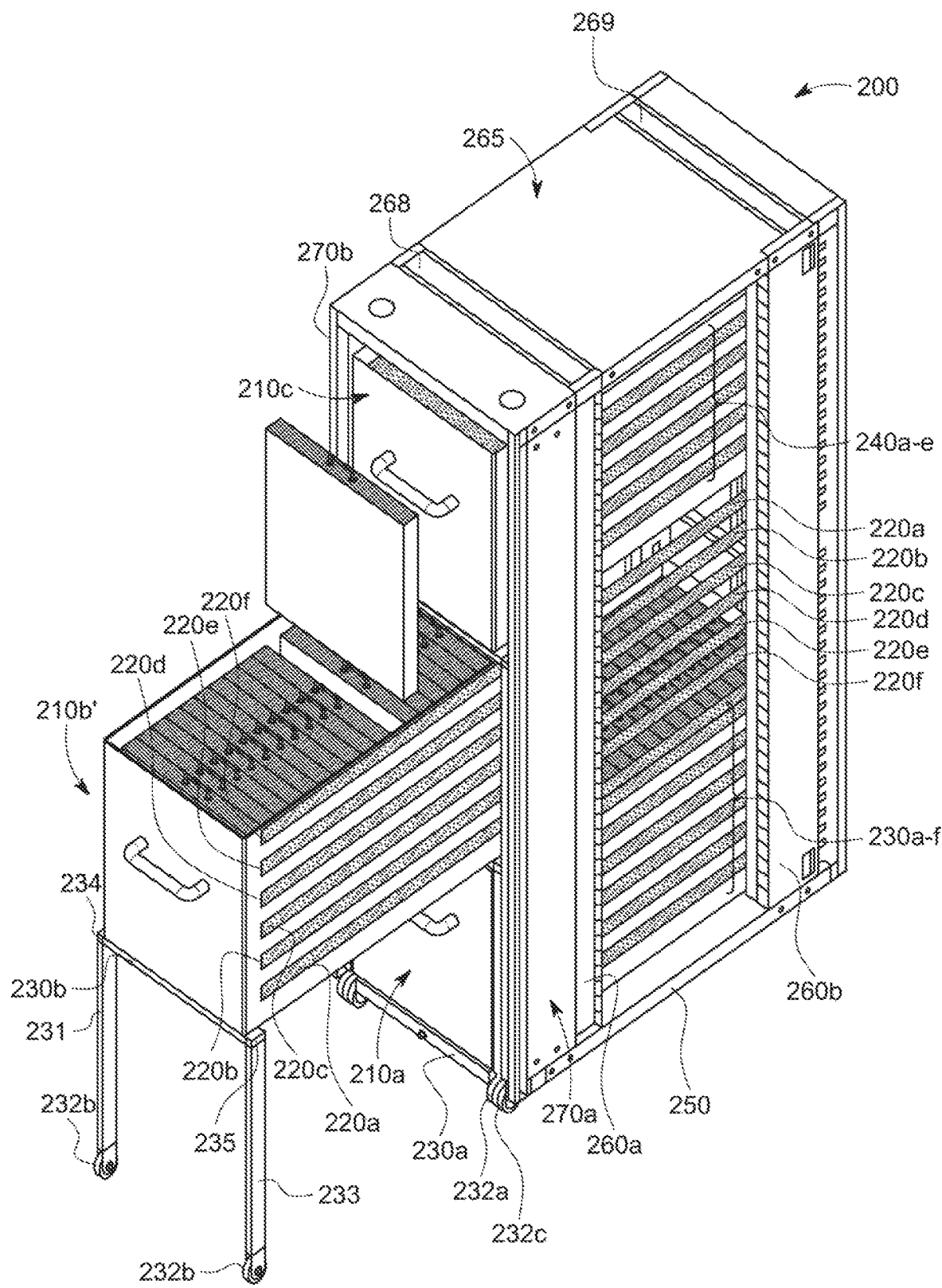
FIG. 3 is a perspective view of the immersion liquid cooling rack of claim 2 depicting the stacked immersion liquid cooling tanks being operable to slide in and out of the rack, according to some implementations of the present disclosure.

Turning now to FIG. 2, a perspective view of an immersion liquid cooling rack 200 is depicted that contains a plurality of stacked immersion liquid cooling tanks, such as tanks 210a, 210b, 210c, in a closed position. Referring to FIG. 3, a perspective view is depicted of the immersion liquid cooling rack of FIG. 2 that contains the stacked immersion liquid cooling tanks, such as tank 210a, 210c, in a closed position; and tank 210b' in an extended open position.

As shown in FIGS. 2 and 3, the rack 200 includes a rectangular bottom frame 250. The bottom frame 250 may include a set of wheels (not shown) attached to the bottom of the frame 250. The wheels can allow the rack 200 to be moved to desired locations in a data center. Side members of the bottom frame 250 support vertical supports 260a, 260b and corresponding opposing vertical supports (not shown) on the other side of the rack 200, that define all or a portion of opposing side walls of the rack 200. A top panel 265 connects the tops of the vertical supports 260a, 260b and corresponding opposing supports. The top panel 265 holds lateral bracing members 268, 269 that connect the tops of the vertical supports 260a, 260b and corresponding opposing vertical supports. Each of the vertical supports 260a, 260b, and corresponding opposing vertical supports, may include holes to allow pins to be inserted to horizontal extendable slider rails that may be installed between the vertical supports. The vertical supports 260a and the corresponding opposing vertical support (not shown), along with a front facing framing support 270a, 270b, define the front end of the rack 200. The rear portion of the rack 200 is defined by the vertical supports 260b, and corresponding opposing vertical support (not shown).

Similar to the immersion liquid cooling tank 100 depicted in FIG. 1, the exemplary immersion liquid cooling tanks 210a, 210b, 210c have a base and side faces for containing a coolant liquid. Each tank 210a, 210b, 210c has a front face walls 212a, 212b, 212c and can have a handle 214a, 214b, 214c for horizontally translating the tank out of the rack 200 to an extended open position, as depicted by tank 210b' in FIG. 3; and into the rack to a closed position, as depicted in FIGS. 2 and 3 by tanks 210a, 210b, 210c. Extendable slide rails are mounted on the side faces of each immersion liquid cooling tank as depicted for tank 210b' in the open position, which includes a plurality of extendable slide rails 220a-f. Similar extendable slide rails are mounted on the opposing side face of tanks 210b'. In addition, the extendable slide rails 220a-f are further mounted to the opposing side walls of the rack 200 that are defined by the vertical supports, such as 260a, 260b, and the opposing vertical supports (not shown). Tanks 210a, 210c also have extendable gliding rails as generally depicted by elements 230a-f and 240a-e that are mounted to opposing side faces of each immersion liquid cooling tank and on opposing side walls of the rack 200. The horizontal extendable slide rails 220a-f, 230a-f, 240a-e are movable between a closed position, as depicted for all three tanks 210a-c in FIG. 2; and an extended open position in the exemplary representative depicted of tank 210b' in FIG. 3. The extendable sliding guide rails allow the immersion liquid cooling tanks 210a-c to slide horizontally in and out of the rack 200. In some implementations, more or fewer extendable sliding rails than illustrated in FIGS. 2 and 3 are used to mount the tanks 210a-c to the side walls, often depending on the operational weight and dimensions of the tank.

Support structures 230a, 230b, 230c are mounted to the base of each of the plurality of immersion liquid cooling tanks 210a, 210b, 210c, respectively. Each support structure 230a-c includes a wheel assembly 232a, 232b, 232c disposed at the base of the support structure 230a-c. In the example of tank 210b, the support structure 230b extends from the base of the immersion liquid cooling tank 210b to a floor surface supporting the rack 200. The horizontal extendable slide rails 220a-f and the support structure 230b with wheel assemblies 232b substantially support an immersion liquid cooling tank in its operational state (e.g., filled with coolant liquid and a plurality of heat generating components) during a horizontal translation of the tank 210b between the closed position (see tank 210b in FIG. 2) and the extended open position (see tank 210b' in FIG. 3).

In some implementations, the immersion liquid cooling tanks 210a-c are vertically aligned in a column, such that one tank, such as tank 210b, is disposed on top of another tank, such as tank 210a. While FIGS. 2 and 3 depict three stacked immersion liquid cooling tanks, in some implementations the rack can be configured to hold two tanks, three tanks, or more than three tanks, that are generally vertically aligned in a column. In addition, as illustrated in FIG. 3 for tank 210b', the support structures for the immersion liquid cooling tanks counter eccentric loads on the immersion liquid cooling tank rack 200 when one or more of the immersion liquid cooling tanks are in the extended open position.

In some implementations, the immersion liquid cooling tanks 210a-c are depicted with an open top, similar to tank 100 in FIG. 1. The open top is inaccessible when the tank is in the closed position and accessible when the tank is the extended open position. The open top allows for heat-generating components to be installed and removed when the immersion liquid cooling tanks are in the extended open position.

In some implementations, the support structures 230a-c include two elongated struts 231, 233, as depicted for exemplary tank 210b, extend downwardly from the base near the front side wall corners 234, 235 of each immersion liquid cooling tank. It is also contemplated, that the front facing surface of the support structures 230a-b are substantially flush with the front face walls 212a, 212b, 212c of the plurality of immersion liquid cooling tanks 210a-c when all the immersion liquid cooling tanks are in the closed position, as depicted in FIG. 2.

The wheel assemblies 232a-c can include caster wheels, a roller, or a similar assembly that allow for the tanks to easily translate horizontally into and out of the rack without significant effort by a data center technician.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An immersion liquid cooling tank rack for heat-generating components, comprising:
   a plurality of immersion liquid cooling tanks each having a base and side faces for containing a coolant liquid;
   horizontal extendable slide rails mounted on opposing side faces of each immersion liquid cooling tank and on opposing side walls of the rack, the horizontal extendable slide rails movable between a closed position and an extended open position to allow the immersion liquid cooling tanks to slide horizontally in and out of the rack; and
   a plurality of support structures mounted to the base of each of the plurality of immersion liquid cooling tanks, each support structure including a wheel assembly disposed at the base of the support structure, the support structures extending from the base of the immersion liquid cooling tank to a floor surface supporting the rack, such that the horizontal extendable slide rails and the support structures with wheel assemblies substantially support an operational immersion liquid cooling tank during a horizontal translation of the tank between the closed position and the extended open position.

2. The immersion liquid cooling tank rack of claim 1, wherein the immersion liquid cooling tanks are vertically aligned in a column such that one tank is disposed on top of another tank.

3. The immersion liquid cooling tank rack of claim 1, wherein the plurality of immersion liquid cooling tanks includes three or more immersion liquid cooling tanks.

4. The immersion liquid cooling tank rack of claim 1, wherein the operational liquid cooling tank includes coolant liquid and a plurality of heat generating components disposed in the tank.

5. The immersion liquid cooling tank rack of claim 1, wherein the plurality of immersion liquid cooling tanks each have an open top that is inaccessible when the tank is in the closed position and accessible when the tank is the extended open position.

6. The immersion liquid cooling tank rack of claim 5, wherein heat-generating components are installed and removed from the open top when the immersion liquid cooling tanks are in the extended open position.

7. The immersion liquid cooling tank rack of claim 1, wherein the plurality of support structures includes two elongated struts extending downwardly from the base near the front side wall corners of each immersion liquid cooling tank.

8. The immersion liquid cooling tank rack of claim 1, wherein a front facing surface of the support structures is substantially flush with the front walls of the plurality of immersion liquid cooling tanks when all the immersion liquid cooling tanks are in the closed position.

9. The immersion liquid cooling tank rack of claim 1, wherein the support structures for the immersion liquid cooling tanks counter eccentric loads on the immersion liquid cooling tank rack when one or more of the immersion liquid cooling tanks are in the extended open position.

10. The immersion liquid cooling tank rack of claim 1, wherein the wheel assembly includes caster wheels.

11. The immersion liquid cooling tank rack of claim 1, wherein the wheel assembly includes a roller.

12. The immersion liquid cooling tank rack of claim 1, wherein each side face of the plurality of immersion liquid cooling tanks has at least two horizontal extendable slide rails.

13. The immersion liquid cooling tank rack of claim 1, wherein the heat-generating components include one or more of a storage server, application server, or switch device.

14. A method for making an immersion liquid cooling tank rack for storing heat-generating components, the method comprising:
   providing a plurality of immersion liquid cooling tanks, each tank defining an interior containment space for holding coolant liquid and heat-generating components;
   installing extendable slide rails on opposing side faces of each immersion liquid cooling tank and on opposing side walls of the rack, the extendable slide rails movable between a closed position and an extended open position to allow the immersion liquid cooling tanks to slide in and out of the rack; and
   mounting a plurality of support structures to the base of each of the plurality of immersion liquid cooling tanks, each support structure including a wheel assembly disposed at the base of the support structure, the support structures extending from the base of the immersion liquid cooling tank to a floor surface supporting the rack
   wherein the horizontal extendable slide rails and the support structures with wheel assemblies substantially support an operational immersion liquid cooling tank during a horizontal translation of the tank between the closed position and the extended open position.

15. The method of claim 14, further comprising vertically aligning the immersion liquid cooling tanks in a column such that one tank is disposed on top of another tank.

16. The method of claim 14, wherein the plurality of immersion liquid cooling tanks includes three or more immersion liquid cooling tanks.

17. The method of claim 14, wherein the plurality of immersion liquid cooling tanks each have an open top that is inaccessible when the tank is in the closed position and accessible when the tank is the extended open position, and wherein heat-generating components are installed and removed from the open top when the immersion liquid cooling tanks are in the extended open position.

18. The method of claim 14, wherein a front facing surface of the support structures is substantially flush with the front walls of the plurality of immersion liquid cooling tanks when all the immersion liquid cooling tanks are in the closed position.

19. The method of claim 14, wherein the support structures for the immersion liquid cooling tanks counter eccentric loads on the immersion liquid cooling tank rack when one or more of the immersion liquid cooling tanks are in the extended open position.

20. The method of claim 14, wherein each side face of the plurality of immersion liquid cooling tanks has at least two horizontal slide rails.

\* \* \* \* \*